(12) United States Patent
Linstadt

(10) Patent No.: US 11,650,944 B2
(45) Date of Patent: May 16, 2023

(54) LOCAL INTERNAL DISCOVERY AND CONFIGURATION OF INDIVIDUALLY SELECTED AND JOINTLY SELECTED DEVICES

(71) Applicant: Rambus Inc., San Jose, CA (US)

(72) Inventor: John Eric Linstadt, Palo Alto, CA (US)

(73) Assignee: Rambus Inc., San Jose, CA (US)

( * ) Notice: Subject to any disclaimer, the term of this patent is extended or adjusted under 35 U.S.C. 154(b) by 0 days.

(21) Appl. No.: 17/534,125

(22) Filed: Nov. 23, 2021

(65) Prior Publication Data

US 2022/0156207 A1 May 19, 2022

Related U.S. Application Data

(63) Continuation of application No. 16/843,871, filed on Apr. 8, 2020, now Pat. No. 11,210,244, which is a continuation of application No. 16/243,055, filed on Jan. 8, 2019, now Pat. No. 10,649,930, which is a continuation of application No. 15/867,646, filed on Jan. 10, 2018, now Pat. No. 10,204,063, which is a continuation of application No. 14/438,865, filed as
(Continued)

(51) Int. Cl.
| | | |
|---|---|---|
| *G06F 13/16* | (2006.01) | |
| *G06F 12/06* | (2006.01) | |
| *G11C 7/10* | (2006.01) | |
| *G11C 7/20* | (2006.01) | |
| *G11C 7/22* | (2006.01) | |
| *G06F 12/02* | (2006.01) | |

(52) U.S. Cl.
CPC ...... *G06F 13/1694* (2013.01); *G06F 12/0246* (2013.01); *G06F 12/0623* (2013.01); *G06F 12/0646* (2013.01); *G11C 7/10* (2013.01); *G11C 7/1045* (2013.01); *G11C 7/20* (2013.01); *G11C 7/22* (2013.01); *G06F 13/1678* (2013.01); *G06F 2212/7206* (2013.01)

(58) Field of Classification Search
None
See application file for complete search history.

(56) References Cited

U.S. PATENT DOCUMENTS 4,667,305 A 5/1987 Dill et al.
5,357,621 A 10/1994 Cox
(Continued)

OTHER PUBLICATIONS

PCT International Search Report dated Mar. 3, 2014 in International Application No. PCT/US2013/070832. 12 pages.

*Primary Examiner* — Michael Alsip
(74) *Attorney, Agent, or Firm* — Amsel IP Law PLLC; Jason Amsel

(57) ABSTRACT

A memory controller interfaces with one or more memory devices having configurable width data buses and configurable connectivity between data pins of the memory devices and data pins of the memory controller. Upon initialization of the memory devices, the memory controller automatically discovers the connectivity configuration of the one or more memory devices, including both individually selected and jointly selected devices. After discovering connectivity of the connected devices, the memory controller configures the memory devices according to the discovered connectivity and assigns unique addresses to jointly selected devices.

20 Claims, 17 Drawing Sheets

Related U.S. Application Data application No. PCT/US2013/070832 on Nov. 19, 2013, now Pat. No. 9,892,068.

(60) Provisional application No. 61/734,203, filed on Dec. 6, 2012.

(56) References Cited

U.S. PATENT DOCUMENTS

| | | | |
|---|---|---|---|
| 5,408,628 A * | 4/1995 | Ameti | G11C 29/765 |
| | | | 714/48 |
| 5,613,078 A | 3/1997 | Kishigami | |
| 5,761,478 A | 6/1998 | Chen et al. | |
| 5,913,044 A | 6/1999 | Tran et al. | |
| 6,481,629 B1 | 11/2002 | Hirabayashi et al. | |
| 7,444,458 B2 | 10/2008 | Norman et al. | |
| 7,877,530 B2 | 1/2011 | Eggleston | |
| 2004/0019756 A1 | 1/2004 | Perego et al. | |
| 2004/0186956 A1 | 9/2004 | Perego et al. | |
| 2010/0232197 A1 | 9/2010 | Park | |
| 2011/0239064 A1 | 9/2011 | Byom et al. | |
| 2012/0198179 A1 | 8/2012 | Ware | |

* cited by examiner

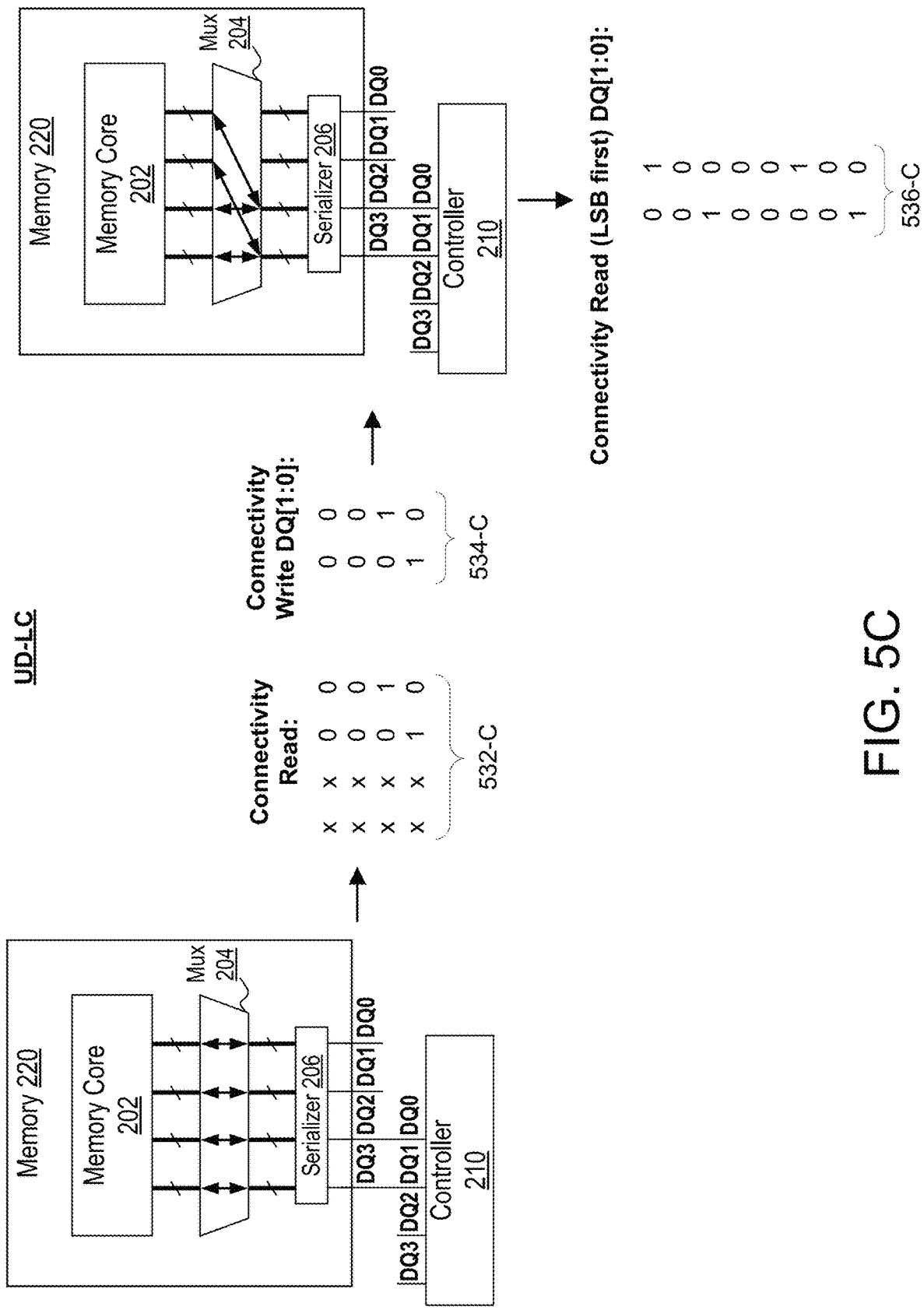

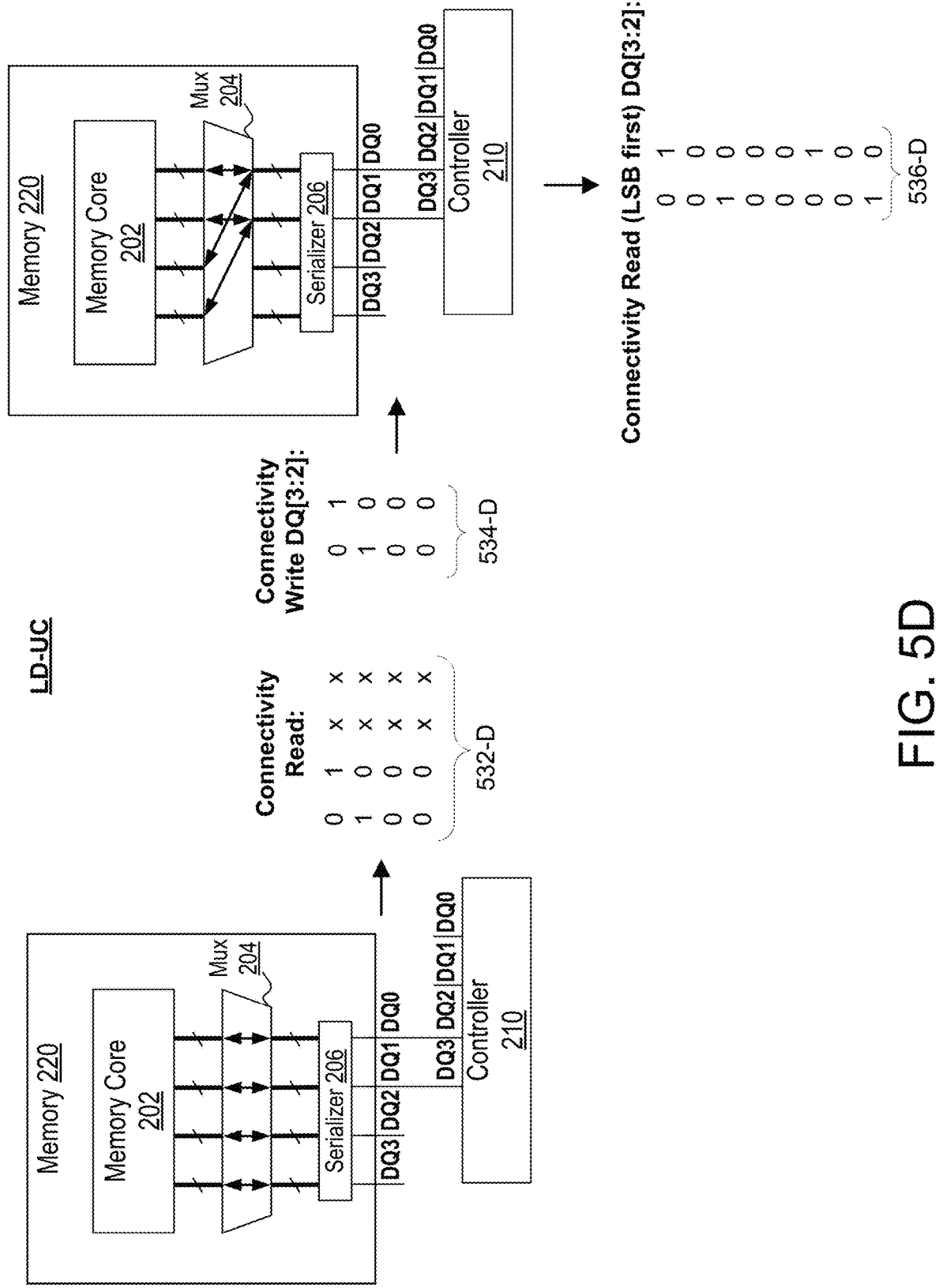

LOCAL INTERNAL DISCOVERY AND CONFIGURATION OF INDIVIDUALLY SELECTED AND JOINTLY SELECTED DEVICES

RELATED APPLICATIONS

This application is a continuation of U.S. patent application Ser. No. 16/843,871 filed on Apr. 8, 2020, now U.S. Pat. No. 11,210,244, which is a continuation of U.S. patent application Ser. No. 16/243,055, filed Jan. 8, 2019, now U.S. Pat. No. 10,649,930, which is a continuation of U.S. patent application Ser. No. 15/867,646, filed Jan. 10, 2018, now U.S. Pat. No. 10,204,063, which is a continuation of U.S. patent application Ser. No. 14/438,865, now issued as U.S. Pat. No. 9,892,068, entered on Apr. 27, 2015 as a U.S. National Phase Application under 35 USC 371(c) of International Application No. PCT/US2013/070832 filed on Nov. 19, 2013, which claims the benefit of U.S. Provisional Application No. 61/734,203 filed on Dec. 6, 2012, the contents of which are each incorporated by reference herein.

BACKGROUND

Solid state storage and memory devices may be designed to support configurable data bus widths. This provides flexibility in the number of memory devices that can be interfaced to a memory controller, thereby enabling expansion of overall capacity while preserving maximum bandwidth. In order to ensure proper communication, both the memory controller and the memory device(s) are typically configured based on the specific connectivity configuration between them. Traditionally, this connectivity information is provided to the memory devices and the memory controller via additional pins on the devices or using an external memory (e.g., the Serial Presence Detect PROM in DIMM systems). Alternatively, bus widths of the configurable devices may be permanently defined (e.g., by blowing fuses) at manufacturing time or module assembly time. However, each of these traditional approaches adds to the overall system cost and complexity.

BRIEF DESCRIPTION OF THE DRAWINGS

The teachings of the embodiments herein can be readily understood by considering the following detailed description in conjunction with the accompanying drawings.

FIG. 5C is a block diagram illustrating an embodiment of data communicated between a memory device and a memory controller during a discovery process when the memory device and memory controller and connected in a third example connectivity configuration.

FIG. 5D is a block diagram illustrating an embodiment of data communicated between a memory device and a memory controller during a discovery process when the memory device and memory controller and connected in a fourth example connectivity configuration.

DETAILED DESCRIPTION OF EMBODIMENTS

A memory controller interfaces with one or more memory devices having configurable width data buses and configurable connectivity between data pins of the memory devices and data pins of the memory controller. Upon initialization of the memory devices, the memory controller automatically discovers the connectivity configuration of the one or more memory devices, including both individually selected and jointly selected devices. After discovering the connectivity of the connected devices, the memory controller configures the memory devices according to the discovered connectivity and assigns unique addresses to jointly selected devices.

System Architecture

Figure 1A:
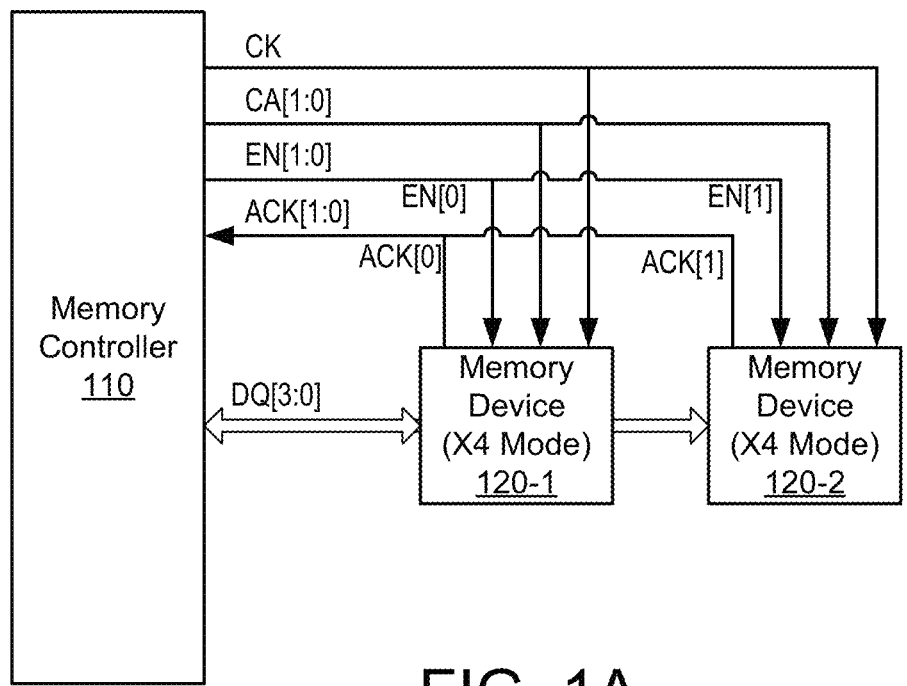
FIG. 1A is a block diagram illustrating an embodiment of a connectivity configuration between a memory controller and two configurable width memory devices.

FIG. 1A illustrates a first configuration of a memory controller 110 interfaced to two individually selectable configurable width memory devices 120 (individually referenced herein as memory device 120-1 and memory device 120-2). Memory devices 120 share the same clock (CK), command/address link (CA[1:0]), and data link (DQ[3:0]). However, devices 120 are provided separate device enable links EN[0], EN[1] respectively, and separate acknowledge links ACK[0], ACK[1] respectively. In the configuration of FIG. 1A, memory devices 120 are configured in a 4-bit data bus width mode (x4 mode), meaning that each memory device 120 is configured to utilize the full 4-bit data link DQ[3:0]. Thus, four bits of parallel data can be transmitted or received by a memory device 120.

In operation, memory controller 110 selects one of the two devices 120 by asserting the corresponding enable link EN[0] or EN[1]. In this configuration, memory controller 110 ensures that only one of the memory devices 120 is selected at time, thereby avoiding data collisions over the shared links. Memory controller 110 sends commands to the selected memory device 120 via command/address link CA[1:0] based on timing of clock signal CK. These commands can include, for example, read commands, write commands, erase commands, and various configuration control commands. In response to receiving a command, the selected memory device 120 sends an acknowledge signal via the acknowledge link ACK. For read and write operations, data is transmitted via data link DQ[3:0] between memory controller 110 and the selected memory device 120 based on timing of clock signal CK.

Figure 1B:
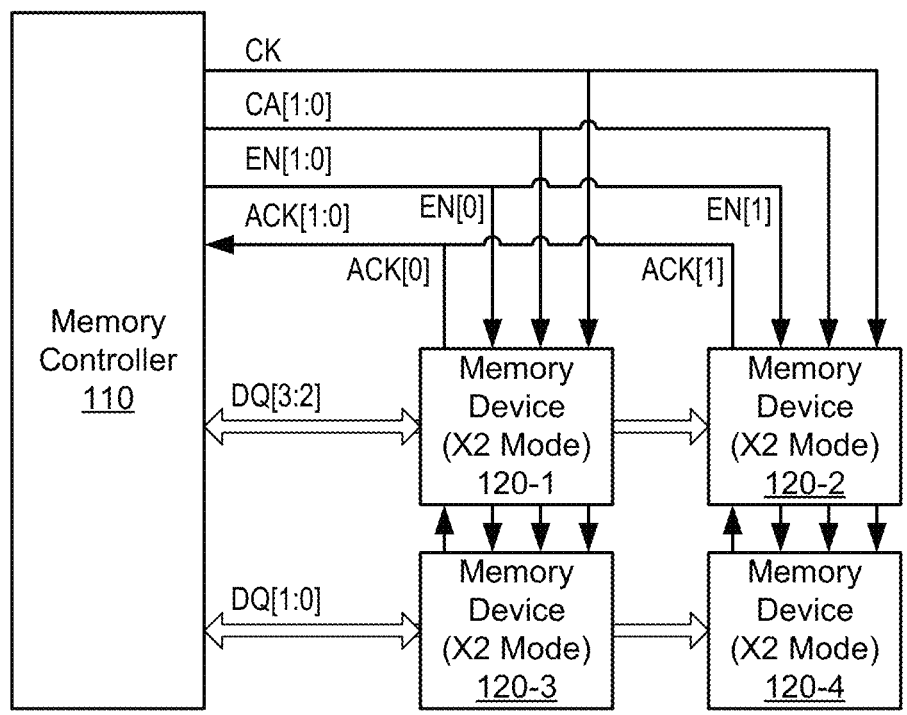
FIG. 1B is a block diagram illustrating an embodiment of a connectivity configuration between a memory controller and four configurable width memory devices.

FIG. 1B illustrates a second configuration of a memory controller 110 interfaced to four configurable width memory devices 120 (individually referenced herein as memory devices 120-1, 120-2, 120-3, 120-4). In this configuration, memory devices 120 are each configured in a 2-bit data bus mode (x2 mode), meaning that only two data pins of each memory device 120 are coupled to memory controller 110 while the remaining two data pins of the memory device 120 are not used. For example, memory devices 120-1, 120-2 are coupled to lanes DQ[3:2] of the data link while memory devices 120-3, 120-4 are coupled to lanes DQ[1:0] of the data link. This configuration enables two memory devices 120 (e.g., memory devices 120-1, 120-3 in FIG. 1B) to take the place of a single memory device (e.g., memory device 120-1 in FIG. 1A) while maintaining the same data loading and bandwidth as the single device but providing twice as much system memory capacity.

Figure 2A:
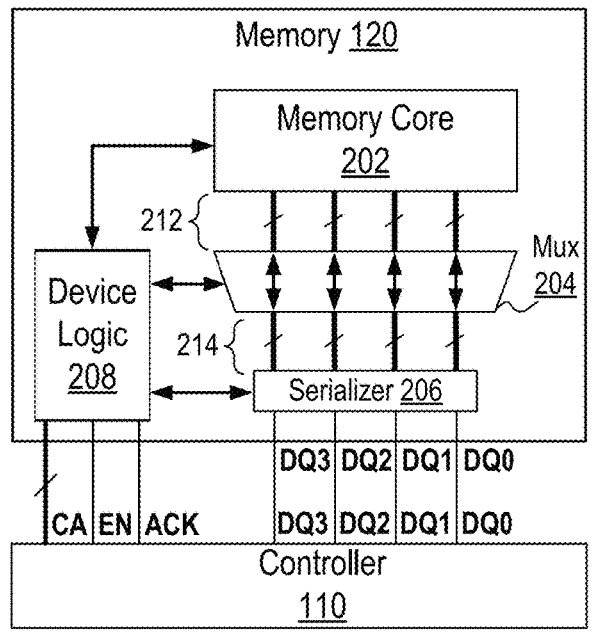
FIG. 2A is a block diagram illustrating an embodiment of a configurable width memory device configured in a four bit wide data bus configuration and coupled to a memory controller.
Figure 2B:
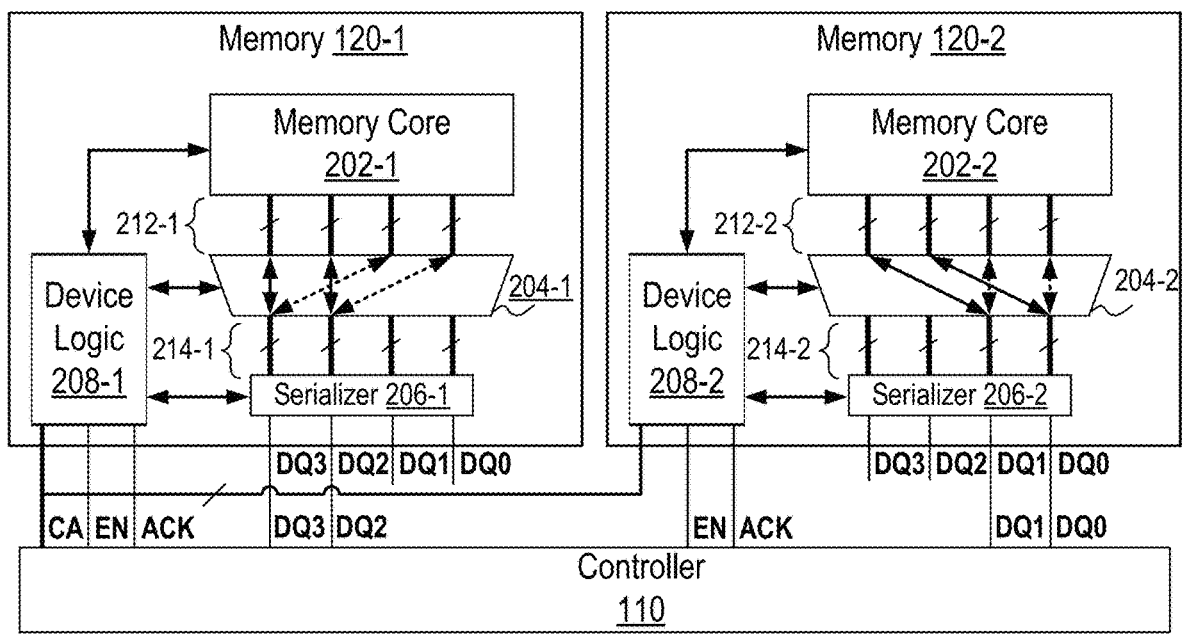
FIG. 2B is a block diagram illustrating an embodiment of a pair of configurable width memory devices configured in two bit wide data bus configurations and coupled to a memory controller.

As in the configuration of FIG. 1A, each of the memory devices 120 in FIG. 2B share the same clock CK and command/address link CA[1:0]. However, in the configuration of FIG. 1B, memory devices 120 are arranged into ranks, such that each of the devices 120 within a rank share the same enable link EN and acknowledge link ACK. For example, memory devices 120-1, 120-3 share enable link EN[0] and acknowledge link ACK[0]. Memory devices 120-2, 120-4 share enable link EN[1] and acknowledge link ACK[1]. By grouping memory devices 120 into ranks that share enable links and acknowledge links, memory controller 110 can interface to all four memory devices 120 without requiring any additional pins on the memory controller 110. In order to distinguish between memory devices 120 in the same rank, each memory device 120 in a rank may be assigned a unique sub-address. The memory controller 110 can then address each memory device 120 individually by including the appropriate sub-address with commands sent via command/address link CA[1:0].

In other alternative configurations, a memory controller 110 can control a plurality of memory devices 120 grouped into different sized ranks. For example, in one embodiment, ranks of four memory devices 120 may be used, with each memory device 120 configured in a 1-bit data bus width mode and occupying a single lane of the data link DQ[3:0]. In other alternative embodiments, a memory controller 110 may support additional ranks by including additional enable links (e.g., one per rank). In other alternative embodiments, similar principles can be applied to memory controllers and memory devices having different width data links such as, for example, 8-bit wide or 16-bit wide data links.

FIG. 2A illustrates an embodiment of an internal architecture of a configurable width memory device 120 coupled to a memory controller 110. In FIG. 2A, configurable width memory device 120 is configured in a 4-bit (x4) data bus width mode. Thus, all four data link pins DQ[3:0] of memory 120 are coupled to corresponding data link pins DQ[3:0] of memory controller 110.

In one embodiment, memory device 120 comprises a memory core 202, a multiplexer 204, a serializer 206, and device logic 208. Memory core 202 comprises an array of memory cells for storing data. In response to a read command (e.g., decoded by device logic 208), memory core 202 outputs requested data via one or more of a first plurality of data buses 212 (e.g., 256-bit wide data buses). In response to a write command, memory core 202 receives data via one or more of the first plurality of data buses 212 and stores the data to an appropriate memory location.

Multiplexer 204 provides switching between the first plurality of buses 212 coupled between memory core 202 and multiplexer 204 and a second plurality of buses 214 coupled between multiplexer 214 and serializer 206. In one embodiment, multiplexer 204 comprises a bi-directional multiplexer-demultiplexer or a full crossbar switch that can be configured to map any of the first plurality of buses 212 to any of the second plurality of buses 214 and vice versa. Alternatively, multiplexer 204 may be constrained to only a limited number of possible configurations such as those described in FIGS. 4A-4E discussed below. The particular switching configuration of multiplexer 204 is configurable via device logic 208.

Serializer 206 serializes data (e.g., 256-bit wide data) received from the second plurality of buses 214 for outputting to data link DQ[3:0]. Similarly, serializer 206 de-serializes data received from data link DQ[3:0] and provides the de-serialized data (e.g., 256-bit wide data) to multiplexer 204 via buses 214.

Device logic 208 controls various functions of memory 120 such as, for example, interpreting the enable signal and commands received via command/address link CA, generating acknowledge signals, and controlling memory core 202, multiplexer 204, and serializer 206 in response to received commands. For example, in response to receiving a read command, device logic 208 controls memory core 202 to output requested data to the first plurality of buses 212. In response to a write command, device logic 208 controls memory core 202 to store data received via the first plurality of buses 212 to an appropriate memory location. In response to various configuration commands, device logic configures memory core 202, multiplexer 204, and/or serializer 206 to configure memory 120 in accordance with the command. Device logic 208 may further include special registers and/or digital logic for carrying out discovery and configuration processes discussed in further detail below.

FIG. 2B illustrates the internal configuration of two memory devices 120 (e.g., a first memory device 120-1 and a second memory device 120-2) configured in 2-bit data bus width mode for combined use with controller 110. As illustrated, in this configuration, controller 110 has its DQ[3:2] pins coupled to DQ[3:2] pins of first memory device 120-1. Pins DQ[1:0] of memory controller 110 are coupled to DQ[1:0] pins of second memory device 120-2. Multiplexers 204-1, 204-2 are further configured based on this particular connectivity configuration. For example, because memory device 120-1 only utilizes data pins DQ[3:2], multiplexer 204-1 operates to route all data to and from memory core 202-1 through data lanes DQ[3:2]. This may be accomplished, for example, by sequentially reading (or writing) the least significant bits (corresponding to DQ[1:0]) of a 4-bit data), and then reading (or writing) the most significant bits (corresponding to DQ[3:2] of the 4-bit data). Similarly, multiplexer 204-2 of second memory device 120-2 operates to route all data to and from memory core 202-2 through data lines DQ[1:0].

While FIG. 2B illustrates one example configuration, it will be apparent that many other connectivity configurations are possible for connecting two memory devices 120 configured in 2-bit (x2) data bus width mode to a memory controller 110. For example, in one embodiment, memory controller 110 and memory devices 120 may enable any available data pin of memory controller 110 to be coupled to any available data pin of a memory device 120. Furthermore, devices 120 may be configured in 1-bit data bus width mode with any data pin of memory device 120 being selectable for interfacing to any available data pin of memory controller 110. Thus, a wide variety of different connectivity configurations are possible.

As will be apparent from FIGS. 2A-2B, the specific connectivity configuration between the memory controller 110 and one or more memory devices 120 will affect how both the memory device 120 and memory controller 110 transmit and interpret received data. Thus, in order to ensure proper operation, each memory device 120 should be appropriately configured depending on the number of data pins coupled to controller 110 and depending on which specific pins of memory device 120 are used. Furthermore, memory controller 110 should be configured depending on how many of its data pins are coupled to each memory device 120 and which specific pins of memory controller 110 are coupled to each memory device 120.

Discovery of Connectivity and Configuration for Individually Selected Devices

A technique is now described for local and internal discovery and configuration of the connectivity configuration of individually selected devices 120 (i.e., devices 120 that do not share an enable link with another device 120).

The processes described below may be performed, for example, upon initialization of one or more configurable width memory devices 120, where the connectivity configuration between the devices 120 and the memory controller 110 is initially unknown.

Figure 3:
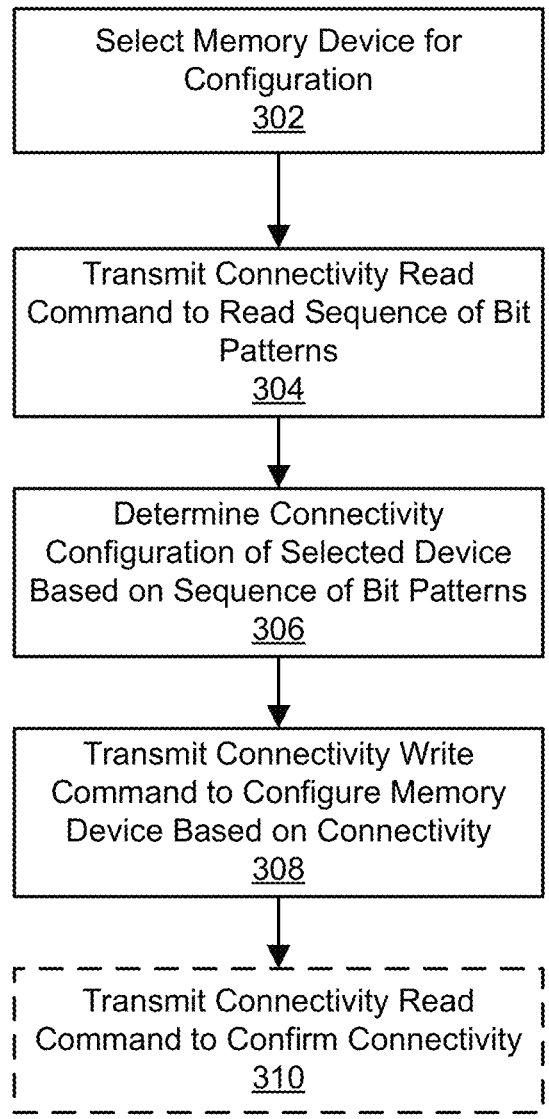
FIG. 3 is a flowchart illustrating an embodiment of a process for discovering connectivity of a configurable width memory device.

FIG. 3 illustrates one embodiment of a process performed by a memory controller 110 for automatically discovering the connectivity of an individually selected memory device 120 and configuring the memory device 120 based on the discovered connectivity. Memory controller 110 selects 302 the memory device 120 for discovery and configuration (e.g., by asserting the enable link for the memory device 120). Memory controller 110 then transmits 304 a "connectivity read" command to memory device 120 (e.g., via the command/address link CA[1:0]). The connectivity read command is recognized by memory device logic 208 of the selected memory device 120, and causes the selected memory device 120 to output a predetermined sequence of data patterns on its data pins DQ[3:0]. In one embodiment, the predetermined sequence of data patterns is pre-stored in a special register of memory device 120 and outputted in response to the connectivity read command. In another embodiment, the predetermined sequence is transmitted from memory controller 110 to memory device 120 with the connectivity read command, and memory device 120 is configured to echo the received sequence of data patterns in response to the connectivity read command. The predetermined sequence of data patterns is configured such that memory controller 110 will see a unique pattern sequence for each different possible connectivity configuration. Memory controller 110 reads the outputted data from memory device 120 (or the portion of it seen by the memory controller's data pins), and determines 306 the connectivity configuration of the selected device 120 based on the sequence of patterns it reads. Memory controller 110 then transmits 308 a "connectivity write" command over the connected data pins that includes sufficient information to communicate the determined connectivity configuration to memory device 120. Memory device 120 can then configure itself appropriately based on the known connectivity (e.g., by ensuring that multiplexer 204 routes all data through the connected pins). Optionally, memory controller 110 can transmit 310 a second connectivity read command after memory device 120 is configured in order to confirm that the discovered connectivity is correct.

Figure 4:
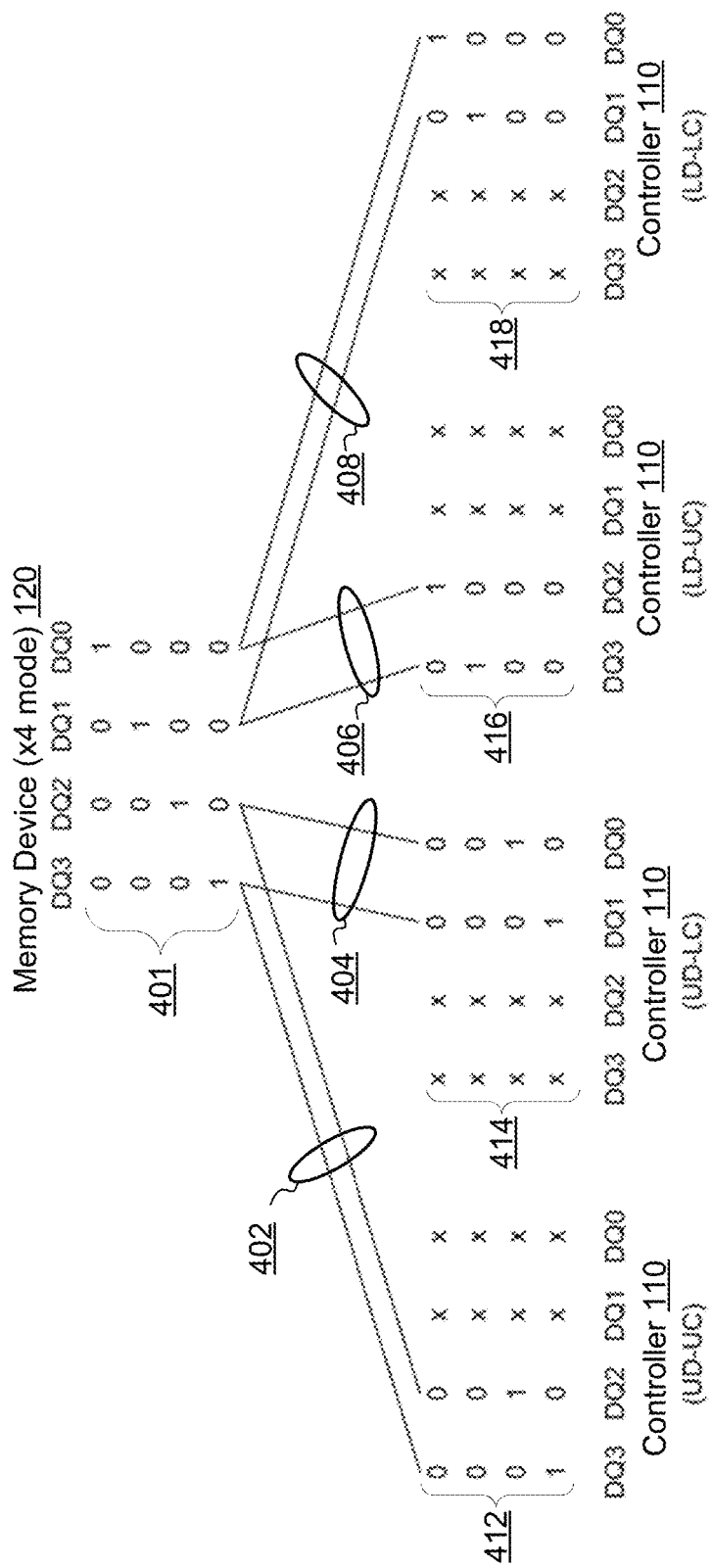
FIG. 4 is a diagram illustrating an example embodiment of data pattern sequences communicated between a memory controller and a memory device for uniquely determining a connectivity configuration of the memory device.

FIG. 4 is a diagram illustrating an example of a sequence of data patterns communicated between a memory device 120 and a memory controller 110 during the discovery process described above. In the described example, it is assumed that memory device 120 is initialized in a 4-bit wide data bus mode configuration. Furthermore, for simplicity of description, only four example connectivity configurations are illustrated in FIG. 4: (1) a "UD-UC" (upper device to upper controller) connectivity configuration 402 in which upper data pins DQ[3:2] of memory device 120 are respectively coupled to the upper data pins DQ[3:2] of memory controller 110; (2) a "UD-LC" (upper device to lower controller) connectivity configuration 404 in which upper data pins DQ[3:2] of memory device 120 are respectively coupled to the lower data pins DQ[1:0] of memory controller 110; (3) a "LD-UC" (lower device to upper controller) connectivity configuration 406 in which lower data pins DQ[1:0] of memory device 120 are respectively coupled to the upper data pins DQ[3:2] of memory controller 110; and (4) a "LD-LC" (lower device to lower controller) connectivity configuration 408 in which lower data pins DQ[1:0] of memory device 120 are respectively coupled to the lower data pins DQ[1:0] of memory controller 110. As will be apparent, other connectivity configurations are also possible.

In this example, memory device 120 (initially configured in x4 mode) outputs a sequence of data patterns 401 in response to the connectivity read command (e.g., from a pre-configured register or by echoing a sequence received from memory controller 110 via the command/address link CA). In this example, each pattern in sequence 401 has one of the bits set to 1 and the remaining bits set to 0. For example, in one embodiment, a "walking 1s" sequence is used where each bit position is set to 1 in one and only one of the data patterns. As will be apparent, if memory device 120 is connected to the memory controller 110 in an x4 connectivity configuration (pins DQ[3:0] of memory device 120 are respectively coupled to pins DQ[3:0] of memory controller 110), memory controller 110 will see the same sequence 401 of data patterns exactly as outputted by memory device 120. However, if memory device 120 is connected in one of the x2 configurations, memory controller 110 will receive only the portion of each data pattern corresponding to the connected data pins. In the example patterns of FIG. 4, data read by memory controller 110 from its uncoupled pin is shown as an "x" value, which could be either a 0 or 1. Although not necessarily the case, "x" values will typically consistently resolve to either 0 or 1 depending on the characteristics of the signal lines (e.g., whether pull-up or pull-down terminations are used).

Beginning with the case where memory controller 110 and memory device 120 are coupled according to a UD-UC connectivity configuration 402, memory controller 110 will see sequence 412 on its data pins; if memory device 120 is connected in the UD-LC connectivity configuration 404, memory controller 110 will see pattern 414 on its data pins; if memory device 120 is connected in the LD-UC connectivity configuration 406, memory controller 120 will see pattern 416 on its data pins; if memory device 120 is connected in the LD-LC connectivity configuration 408, memory controller 110 will see pattern 418 on its data pins. As can be seen, each of the possible patterns received by the memory controller will be unique, assuming that the "x" values for the uncoupled pins resolve in a consistent manner. Thus, based on the observed pattern sequence, memory controller 110 can determine which connectivity configuration is present for the selected memory device 120. Even if the "x" values resolve inconsistently, the connectivity can still be uniquely determined in most cases, except in the unlikely scenario that the "x" values happen to resolve in a way that exactly matches one of the other possible pattern sequences. To insure against this possibility, memory controller 110 may verify the discovered connectivity after configuring memory device 120 as will be described below, and repeat the discovery process if necessary.

FIGS. 5A-5E illustrate examples of the pattern sequences communicated in the connectivity read command, connectivity write command, and second (verification) connectivity read command for each of the example connectivity configurations described above. For simplicity of description, FIGS. 5A-5E omit portions of the memory device 120, controller 110, and the connections between them that are not necessary for understanding the principles herein.

Figure 5A:
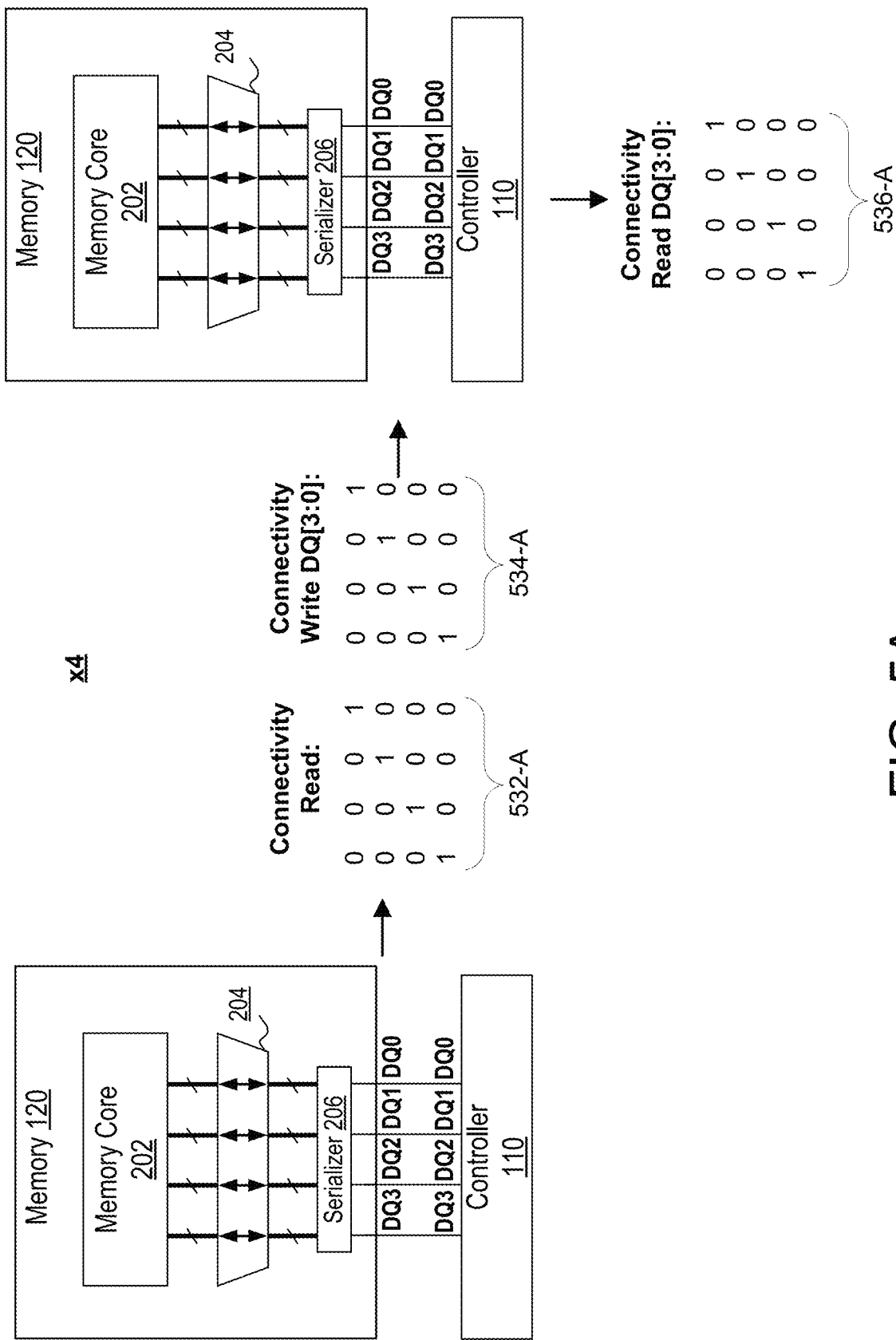
FIG. 5A is a block diagram illustrating an embodiment of data communicated between a memory device and a memory controller during a connectivity discovery process when the memory device and memory controller and connected in a first example connectivity configuration.

In FIG. 5A, memory device 120 is coupled to memory controller 110 in the x4 connectivity configuration. Thus, in response to a connectivity read command, memory controller 110 sees pattern sequence 532-A, indicating that memory device 120 is connected in the x4 connectivity configuration. Controller 110 then transmits a connectivity write sequence including a representation of the discovered connectivity configuration in the form of pattern sequence 534-A transmitted via data link DQ[3:0]. In one embodiment, the sequence 534-A of data patterns transmitted in the connectivity write operation can be the same sequence 532-A seen by memory controller 110 in response to the connectivity read command because this sequence will uniquely define the connectivity. Memory device 120 can then configure its multiplexer 204 based on the connectivity configuration. In this case, multiplexer 204 is configured in the x4 configuration with the data routed straight through on each lane of data link DQ[3:0]. Memory controller 110 then issues a second connectivity read command. Because the configuration of multiplexer 204 is left unchanged in this example, the sequence of data patterns 536-A seen by memory controller 110 in response to the command is the same as sequence 532-A seen in response to the first connectivity read command. Upon verifying the pattern sequence 536-A, memory controller 110 can confirm that the memory device 120 is correctly configured. If the sequence does not match the expected sequence 536-A, memory controller 110 may repeat the discovery process or issue an error signal indicating that discovery cannot be completed.

Figure 5B:
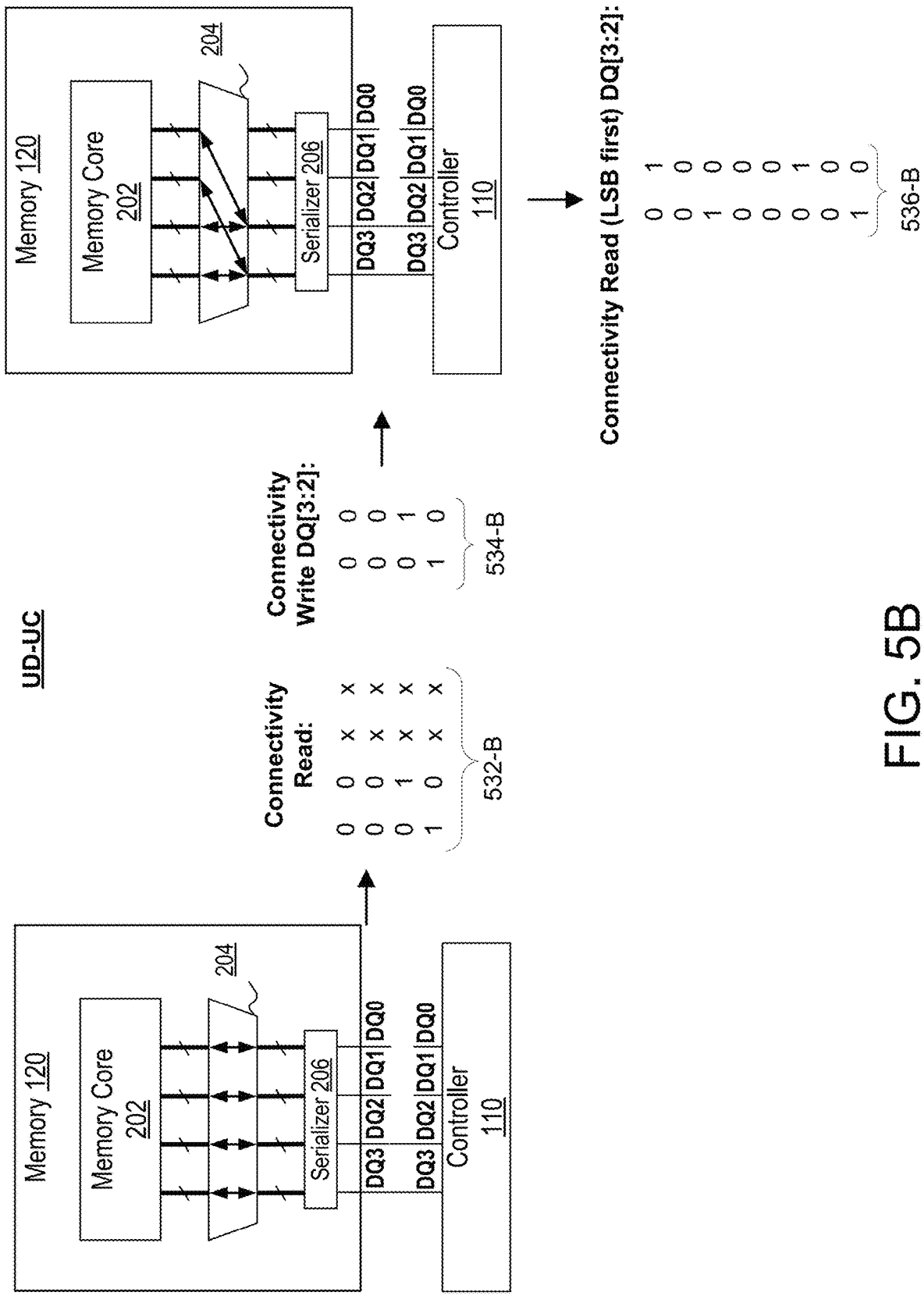
FIG. 5B is a block diagram illustrating an embodiment of data communicated between a memory device and a memory controller during a discovery process when the memory device and memory controller and connected in a second example connectivity configuration.

In FIG. 5B, memory device 120 is coupled to memory controller 110 in a UD-UC configuration 402 such that the upper portion of the data pins (DQ[3:2]) of memory device 120 are respectively coupled to the upper portion of the data pins (DQ[3:2]) of memory controller 110. In response to the connectivity read command, memory controller 110 sees the sequence of data patterns 532-B. Memory controller 110 then performs a connectivity write operation in order to communicate the discovered connectivity configuration to memory device 120. For example, memory controller 110 may write back the same pattern sequence 534-B seen on DQ[3:2] which indicates to memory device 110 that only pins DQ[3:2] of memory device 120 are coupled to controller 110, and furthermore that these pins are respectively coupled to DQ[3:2] pins of memory controller 110. Memory device 120 then configures its multiplexer 204 accordingly to route all data through DQ[3:2]. In order to verify connectivity, memory controller 110 issues a second connectivity read command and should observes sequence 536-B if the connectivity has been correctly discovered. Here, because memory device 120 is configured to transmit each 4-bit pattern over only two available data lanes DQ[3:2], memory device 120 outputs the two least significant bits first, followed by the two most significant bits. If the observed sequence does not match the expected sequence 536-B, memory controller 110 may repeat the discovery process or issue an error signal indicating that discovery cannot be completed.

FIG. 5C similarly illustrates expected data pattern sequences communicated between memory controller 110 and memory device 120 when connected in a UD-LC connectivity configuration 404. For example, in response to the connectivity read command, memory controller 110 observes sequence 532-C. Memory controller 110 then writes back sequence 534-C on data lanes DQ[1:0] in the connectivity write operation, and memory device 120 configures its multiplexer 204 accordingly. Memory controller 110 then transmits a second connectivity read command and verifies connectivity if it observes expected sequence 536-C in response. If the observed sequence does not match the expected sequence 536-C, memory controller 110 may repeat the discovery process or issue an error signal indicating that discovery cannot be completed.

FIG. 5D similarly illustrates expected data pattern sequences communicated between memory controller 110 and memory device 120 when connected in a LD-UC connectivity configuration 406. For example, in response to the connectivity read command, memory controller 110 observes sequence 532-D. Memory controller 110 then writes back sequence 534-D on data lanes DQ[3:2] in the connectivity write operation, and memory device 120 configures its multiplexer 204 accordingly. Memory controller 110 then transmits a second connectivity read command and verifies connectivity if it observes expected sequence 536-D in response. If the observed sequence does not match the expected sequence 536-D, memory controller 110 may repeat the discovery process or issue an error signal indicating that discovery cannot be completed.

Figure 5E:
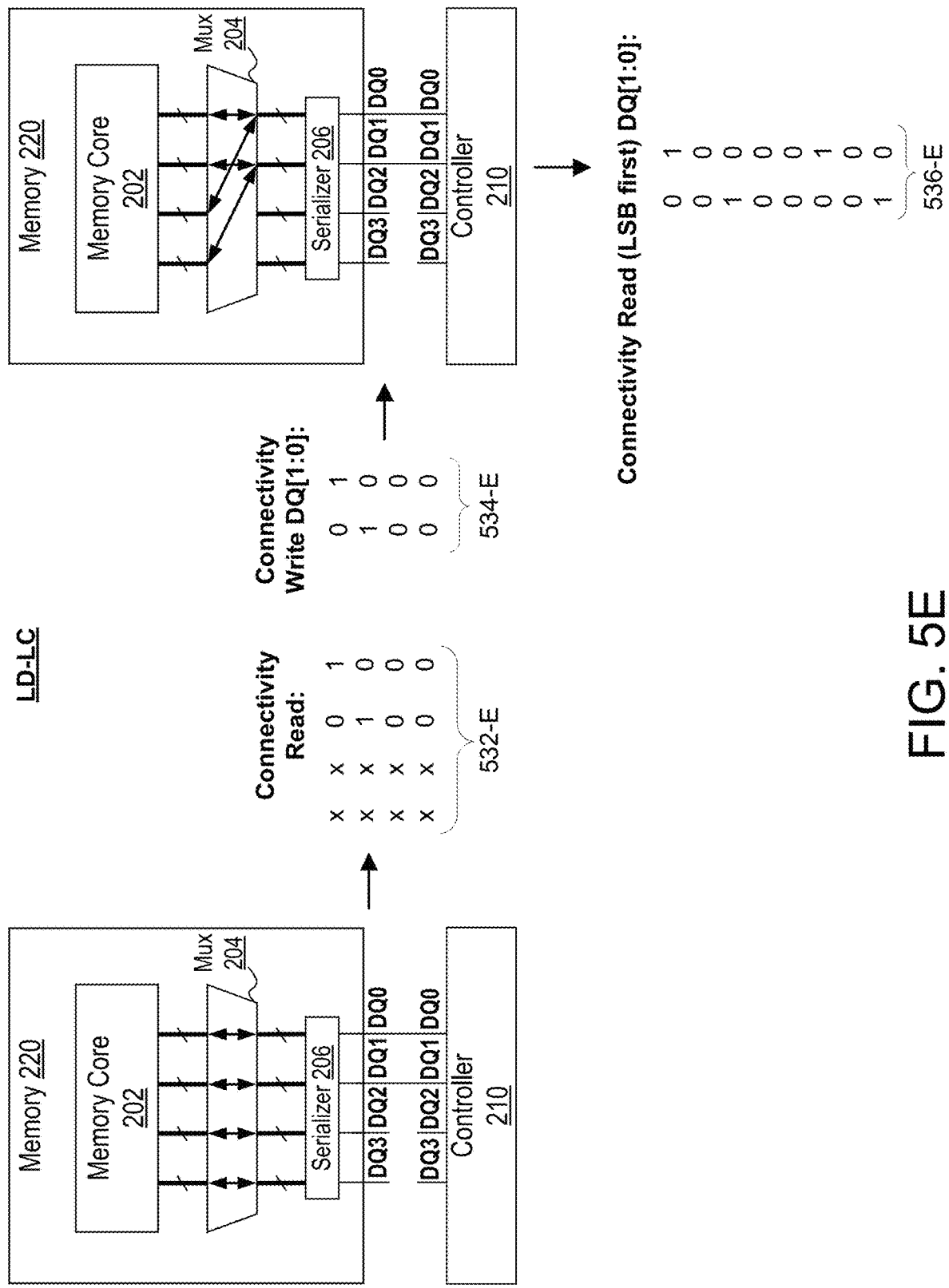
FIG. 5E is a block diagram illustrating an embodiment of data communicated between a memory device and a memory controller during a discovery process when the memory device and memory controller and connected in a fifth example connectivity configuration.

FIG. 5E similarly illustrates expected data pattern sequences communicated between memory controller 110 and memory device 120 when connected in a LD-LC connectivity configuration 408. For example, in response to the connectivity read command, memory controller 110 observes sequence 532-E. Memory controller 110 then writes back sequence 534-E on data lanes DQ[1:0] in the connectivity write operation, and memory device 120 configures its multiplexer 204 accordingly. Memory controller 110 then transmits a second connectivity read command and verifies connectivity if it observes expected sequence 536-E in response. If the observed sequence does not match the expected sequence 536-E, memory controller 110 may repeat the discovery process or issue an error signal indicating that discovery cannot be completed.

Although an example set of connectivity configurations are discussed above, the possible connectivity configurations between memory device 120 and memory controller 110 are not necessarily constrained to these examples. For example, using a full crossbar multiplexer 204 enables a variety of other possible ways to connect a memory device 120 and a memory controller in an x2 configuration. Furthermore, in another embodiment, a memory device 120 may be connected to only a single data pin of memory controller 110 (x1 configuration). Additionally, memory device 120 and memory controller 110 may enable arbitrary connections between them such that any pin of memory controller 110 may be connected to any pin of memory device 120. This may beneficially enable minimization of routing constraints and improve flexibility in layout and design of a memory system.

In other alternative embodiment where constraints do exist (i.e., the possible connectivity configurations are limited), a different sequence of data patterns may be used in the connectivity read command that is not necessarily the sequence 401 used in the examples above. For example, depending on the configuration constraints, a more compact sequence of data patterns or even a single data pattern may still provide unique results that would enable a memory controller 110 to uniquely determine the connectivity configuration of an individually selected device.

Discovery of Connectivity for and Configuration of Jointly Selected Devices

A technique is now described for discovering connectivity and configuring memory devices 120 that are jointly selected (i.e., two or more devices are in the same rank and share the same enable link). The technique is similar to the discovery and configuration technique described above, except memory controller 110 should now also account for the possibility that data observed on its data pins during the discovery process may be coming from either a single device, two jointly selected memory devices, or more than two jointly selected devices. In some situations, the connectivity read operation under these circumstances may yield connectivity information that is initially ambiguous, and additional operations may be performed in order to resolve the ambiguity as will be described below.

Figure 6:
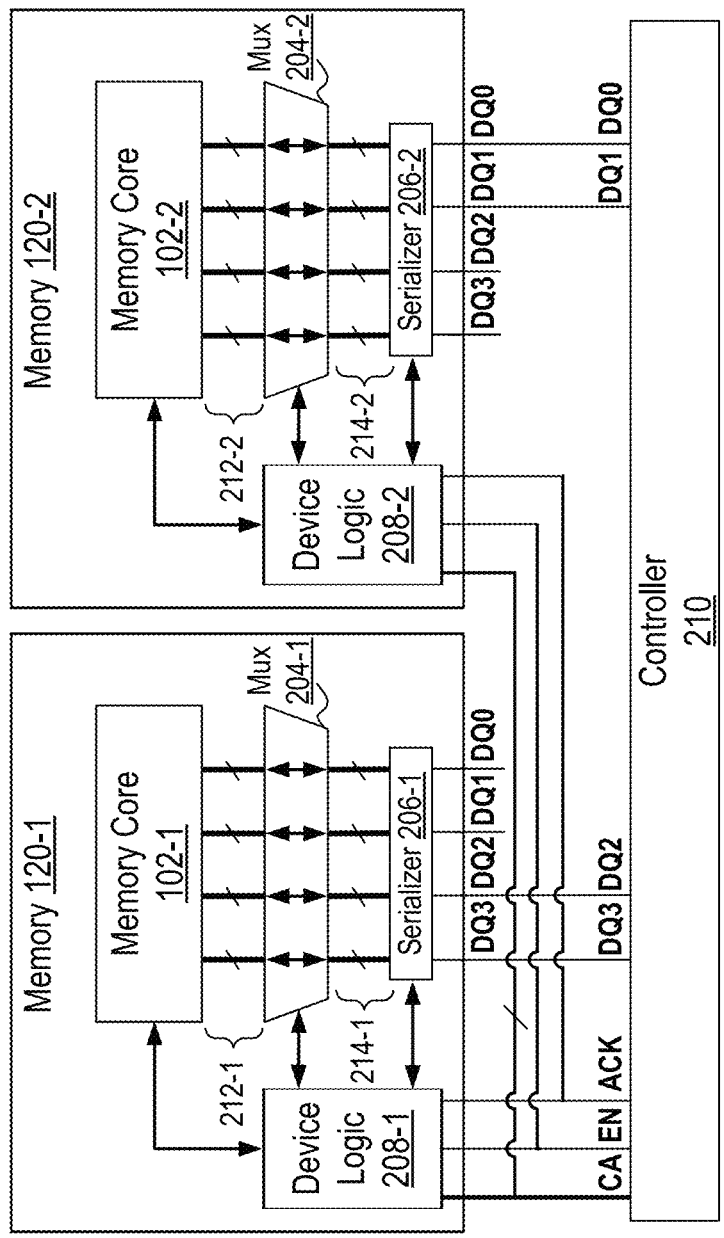
FIG. 6 is a block diagram illustrating an embodiment of jointly selected memory devices according to an example connectivity configuration.

FIG. 6 illustrates on example configuration of a memory controller 110 coupled to jointly selected memory devices 120 (individually referenced as a first memory device 120-1 and a second memory device 120-2). Here, first memory device 120-1 and second memory device 120-2 are each configured in a 2-bit data bus width mode for combined use with controller 110. Memory devices 120-1, 120-2 are in the same rank and share an enable link EN, such that both devices 120 are jointly enabled or disabled. As illustrated, controller has its DQ[3:2] pins coupled to DQ[3:2] pins of first memory device 120-1. Pins DQ[1:0] of memory controller 110 are coupled to DQ[1:0] pins of second memory device 120-2. As will be apparent, a number of other possible connectivity configurations are possible in which the memory controller 110 is coupled to two or more devices 120 that are jointly selected and utilize different portions of the available data pins of controller 110.

Figure 7:
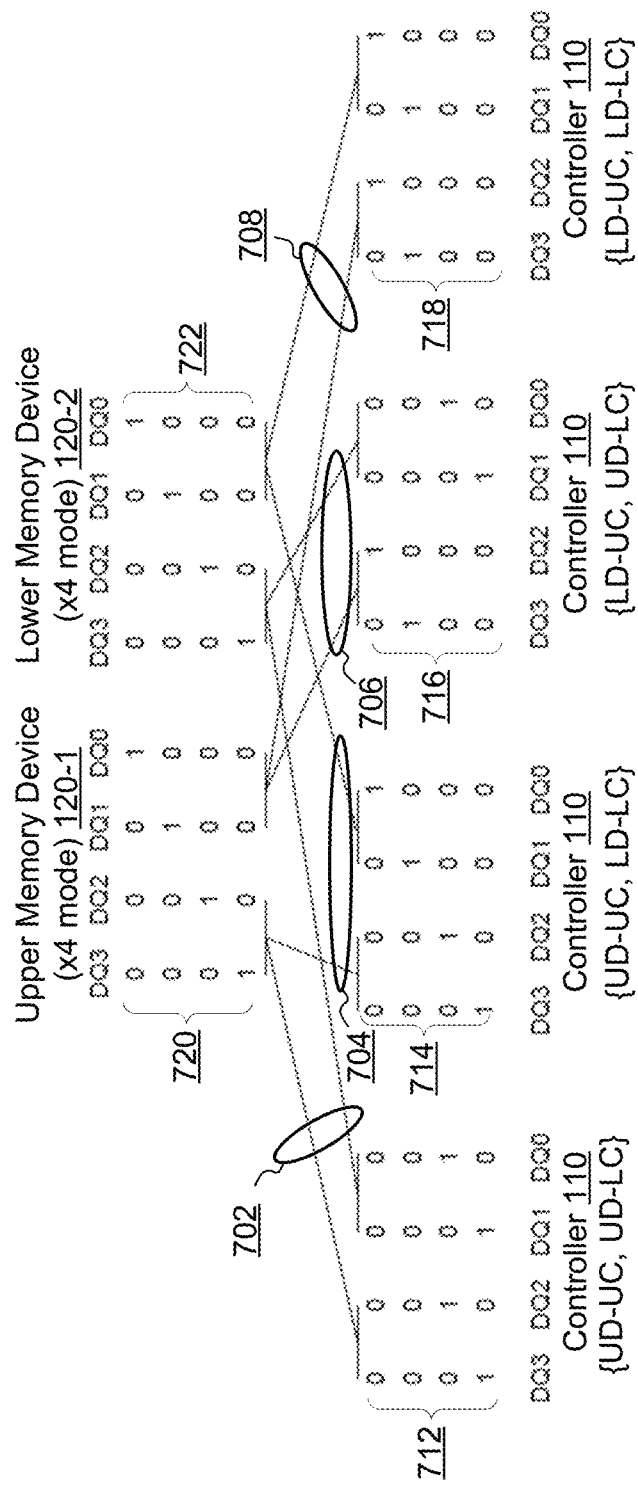
FIG. 7 is a diagram illustrating an embodiment of data pattern sequences communicated between a memory controller and two jointly selected memory devices for determining a connectivity configuration of the jointly selected memory devices.

FIG. 7 is a diagram illustrating an example of a sequence of data patterns communicated between a memory controller 110 and two jointly selected memory devices 120 (e.g., an "upper" device 120-1 coupled to the upper pins DQ[3:2] of the memory controller 110 and a "lower" device 120-2 coupled to the lower pins DQ[1:0] of the memory controller 110) during the discovery process described above. In the illustrated example, four different connectivity configurations are illustrated: (1) a "{UD-UC, UD-LC}" connectivity configuration 702 in which upper data pins DQ[3:2] of upper memory device 120-1 are respectively coupled to the upper data pins DQ[3:2] of memory controller 110, and the upper data pins DQ[3:2] of lower memory device 120-2 are respectively coupled to the lower data pins DQ[1:0] of memory controller 110; (2) a "{UD-UC, LD-LC}" connectivity configuration 704 in which upper data pins DQ[3:2] of upper memory device 120-1 are respectively coupled to the upper data pins DQ[3:2] of memory controller 110, and the lower data pins DQ[1:0] of lower memory device 120-2 are respectively coupled to the lower data pins DQ[1:0] of memory controller 110; (3) a "{LD-UC, UD-LC}" connectivity configuration 706 in which lower data pins DQ[1:0] of upper memory device 120-1 are respectively coupled to the upper data pins DQ[3:2] of memory controller 110, and the upper data pins DQ[3:2] of lower memory device 120-2 are respectively coupled to the lower data pins DQ[1:0] of memory controller 110; and (4) a "{LD-UC, LD-LC}" connectivity configuration 708 in which lower data pins DQ[1:0] of upper memory device 120-1 are respectively coupled to the upper data pins DQ[3:2] of memory controller 110, and the lower data pins DQ[1:0] of lower memory device 120-2 are respectively coupled to the lower data pins DQ[1:0] of memory controller 110.

Based on these different connectivity configurations, different sequences of data patterns (e.g., sequences 712, 714, 716, 718) are seen by controller 110 in response to a connectivity read operation. Most of these sequences (sequences 712, 716, 718) can be uniquely identified from each other and from the sequences of FIG. 4 discussed above. Thus, in most cases memory controller 110 can correctly discover the connectivity of the one or more devices (either individual selected or two jointly selected devices) based on received the sequence of data patterns without any further operations.

However, the sequence 714 seen for two jointly selected devices 120 in a {UD-UC, LD-LC} connectivity configuration is the same sequence as the sequence 502-A that is seen by memory controller 110 when a single device 120 is connected in a x4 configuration (see FIG. 5A). Therefore, this sequence 714 (and sequence 502-A) yields an ambiguous connectivity result. In order to resolve the ambiguity when this sequence is observed, memory controller 110 performs additional operations to determine whether a single memory device 120 in a x4 configuration is connected or whether two devices 120 are connected and jointly selected in a {UD-UC, LD-LC} configuration.

Figure 8:
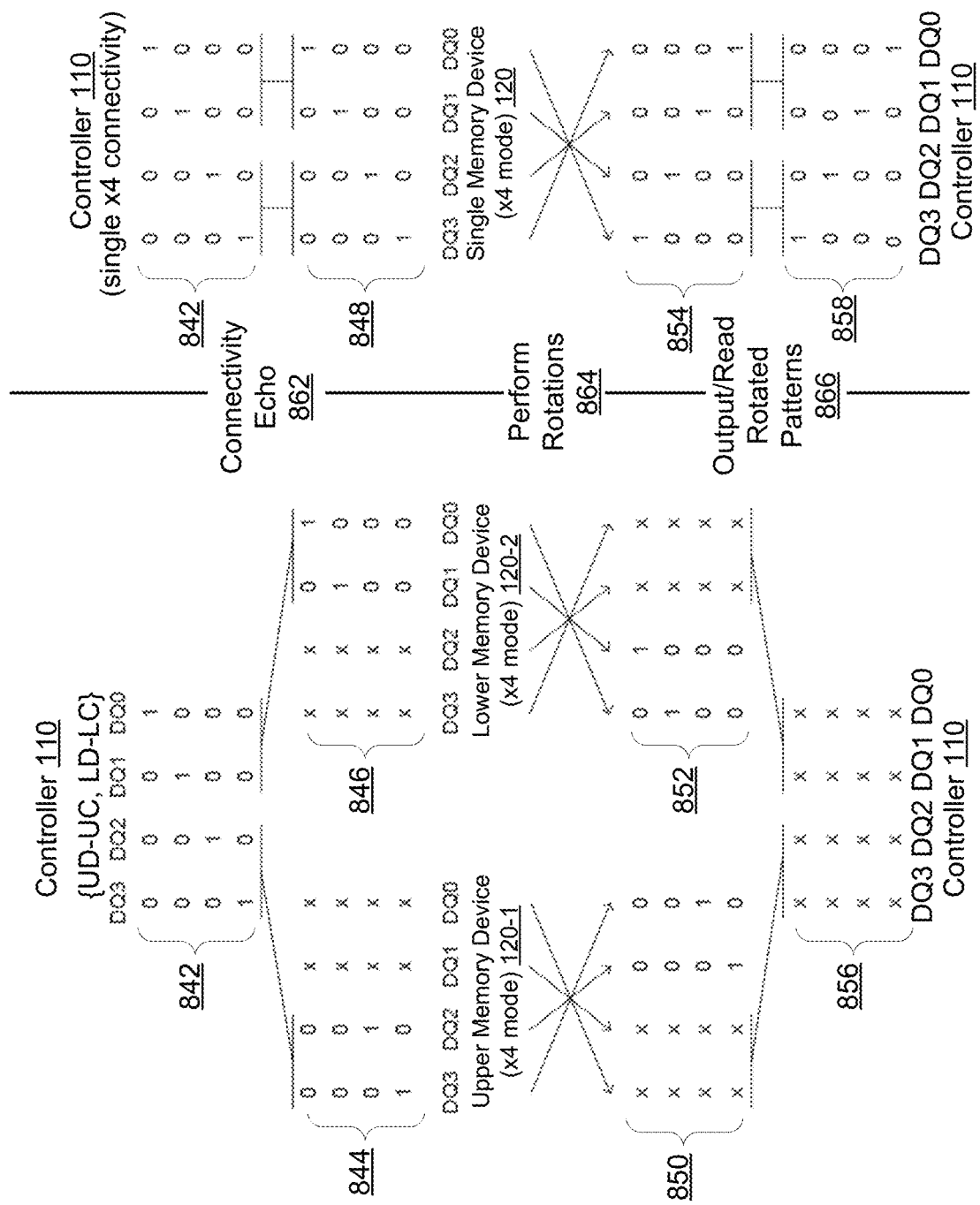
FIG. 8 is a diagram illustrating an embodiment of data pattern sequences communicated between one or more memory devices and a memory controller to resolve ambiguity in an ambiguously discovered connectivity configuration.

FIG. 8 illustrates an example embodiment of a technique for resolving the ambiguity between the above described connectivity configurations that may be implemented when the ambiguous data pattern 714 is observed. Memory controller issue a "connectivity echo" command 862 in which memory controller 110 writes (echoes) the pattern sequence 842 it received from the connectivity read operation. When a single device is connected, the device 120 will see pattern sequence 848 on its four input pins DQ[3:0] and stores the received sequence 848 to a special device register. On the other hand, when two devices 120-1, 120-2 are connected in the {UD-UC, LD-LC} configuration, the devices 120-1, 120-2 will each see only a portion of sequence 842 corresponding to their respective connected pins. For example, upper device 120-1 will observe the sequence 844 while lower device 120-2 will observe the sequence 846. Each device 120-1, 120-2 stores their respectively received pattern sequences 844, 846 to a special device register. Devices 120 then perform a rotation operation 864. Here, the devices 120 rotate the received bits stored in their special registers such that for each pattern in the sequence, each bit in a bit position in the upper half of the pattern is moved to a bit position in the lower half of the pattern and vice versa. For example, when a single device 120 is connected, the bits may be rotated as indicated in operation 864 to yield pattern sequence 854. Similarly, when two devices 120-1, 120-2 are jointly connected, each device 120-1, 120-2 rotates bits in their respective special registers as indicated in step 864 yielding the sequence 850 for upper device 120-1 and yielding sequence 852 for lower device 120-2. The specific bit re-ordering in step 864 is not the only possible way to re-order the bits to achieve the desired effect, and in alternative embodiments a different rotation scheme may be used.

In step 866, memory devices 120 output their respective sequences of rotated data patterns and memory controller 110 observes the sequence of patterns on its DQ[3:0] pins. Thus, in the case where two devices 120-1, 120-2 are jointly selected, memory controller 110 will observe sequence 856 (which typically resolves to consistent values). In the case where only one device 120 is connected, memory controller 110 will instead see sequence 858. Based on the observed sequences (either 856 or 858) memory controller 110 can then determine which connectivity configuration is present and configure the device(s) 120 accordingly.

Address Configuration for Jointly Selected Devices

Figure 9:
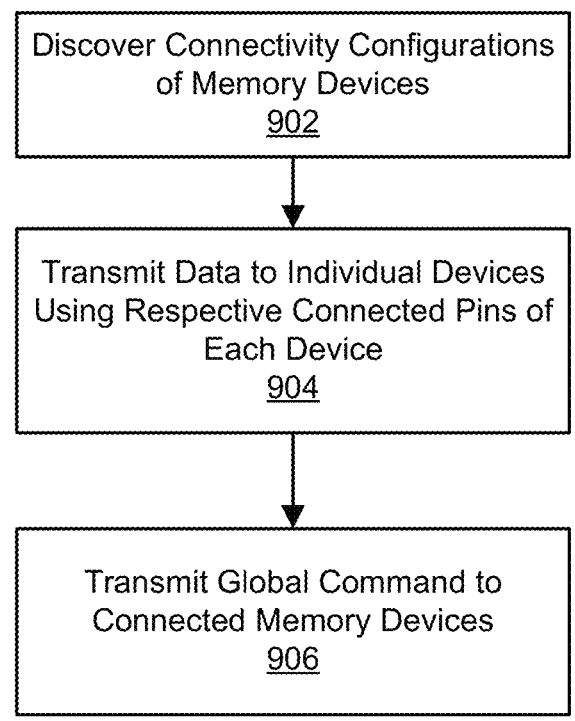
FIG. 9 is a flowchart illustrating an embodiment of a process for assigning unique addresses to jointly selected memory devices.

Once memory controller 110 discovers the connectivity configurations of jointly selected devices 120, memory controller 110 next assigns unique addresses to each jointly selected device 120 so that commands can be individually directed to different devices 120. FIG. 9 illustrates an embodiment of a process for assigning addresses to jointly selected memory devices 120. Memory controller 110 first discovers 902 the connectivity configuration of connected memory devices 120 (e.g., using the discovery techniques discussed above). Once the connectivity configuration is known, memory controller 110 transmits data to each connected device 120 using the known connectivity of the data pins. For example, memory controller 110 can transmit different data to the different devices 120 because memory controller 110 knows which of its data pins are connected to which device 120. Memory controller 110 also transmits 906 a global command to each of the jointly selected memory devices (e.g., via command/address link CA) that instructs the memory devices 120 to configure their respective address registers based on the data seen on a specific pin. This process enables the memory controller 110 to assign a unique address to each jointly selected device 120 even though the devices share a command/address link CA and do not previously know how they are connected.

Examples of the process of FIG. 9 are now described in FIGS. 10A-10D for the example connectivity configurations discussed above. In these examples, each memory device 120 has a two bit address register that is assigned to either 01 or 10. These examples furthermore assume that the devices 120 will observe 0s on unconnected pins (i.e., "x" values are 0). As will be apparent, the examples described herein can easily be modified to account for scenarios where the unconnected pins resolve differently.

Figure 10A:
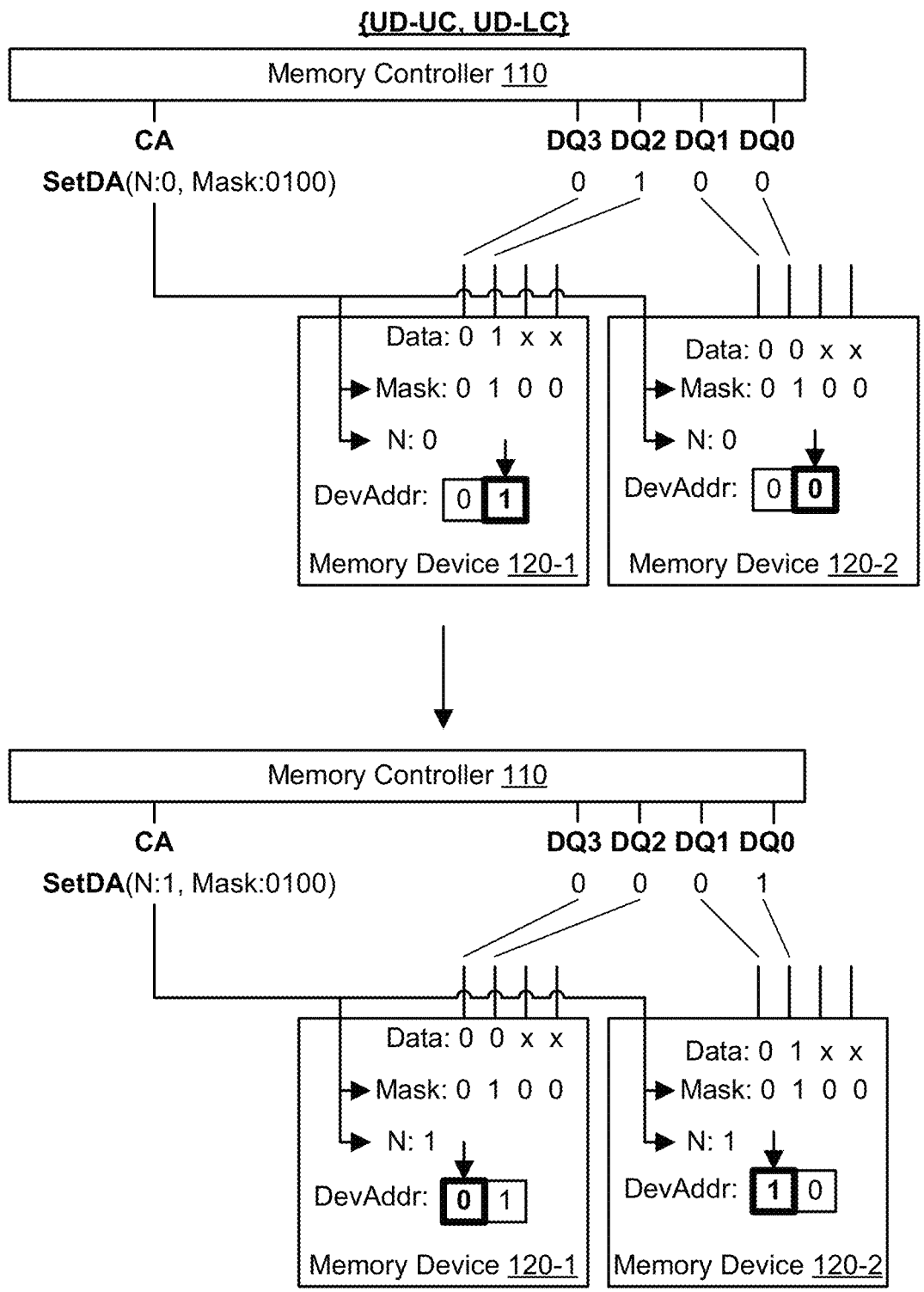
FIG. 10A is a diagram illustrating an example embodiment of data communicated between a memory controller and two jointly selected memory devices for assigning unique addresses to each of the jointly selected memory devices when the memory devices are configured in a first example connectivity configuration.
Figure 10B:
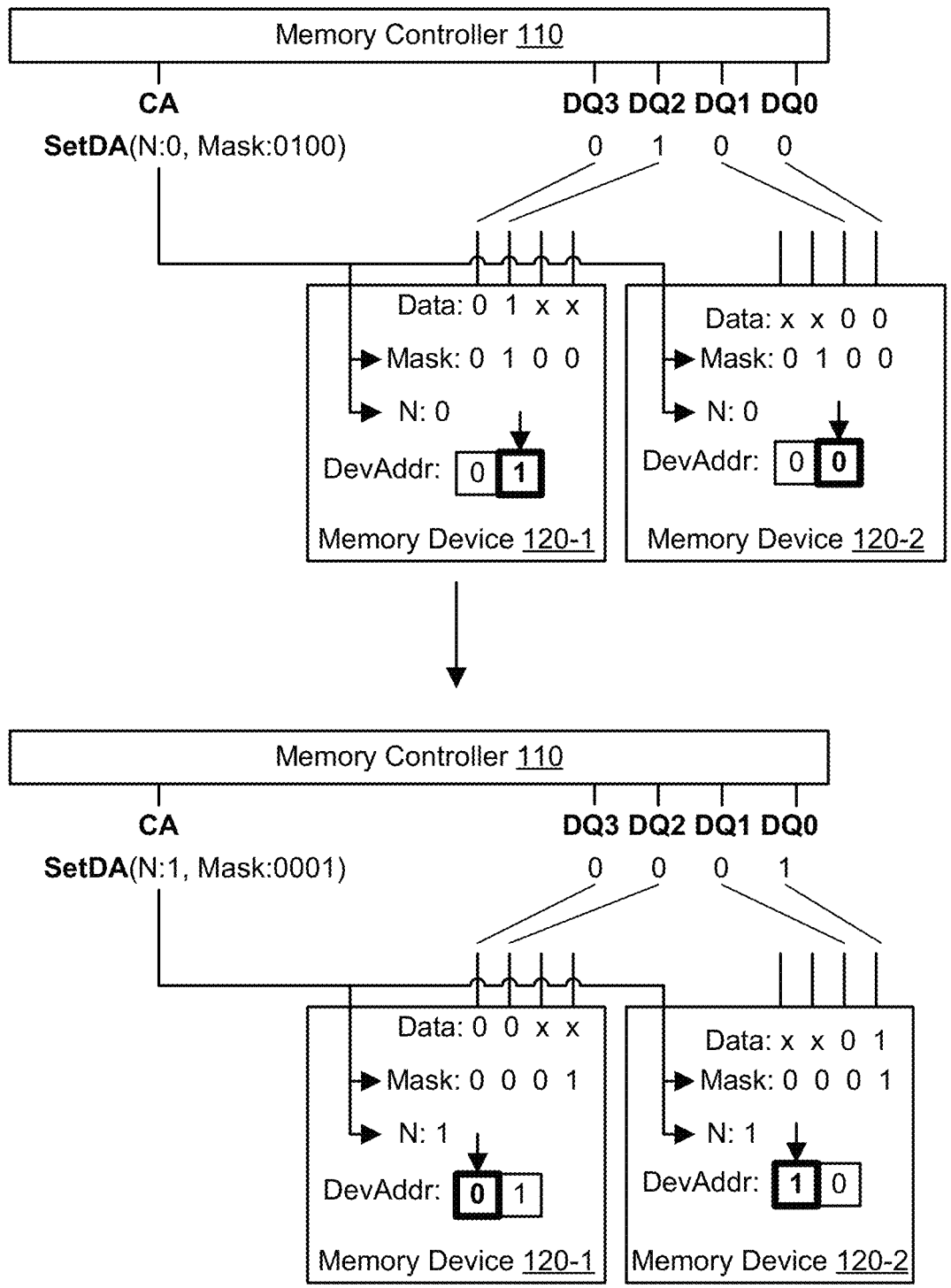
FIG. 10B is a diagram illustrating an example embodiment of data communicated between a memory controller and two jointly selected memory devices for assigning unique addresses to each of the jointly selected memory devices when the memory devices are configured in a second example connectivity configuration.

In the example of FIG. 10A, memory controller 110 has determined that two jointly selected devices 120 are connected in a {UD-UC, UD-LC} connectivity configuration. Memory controller 110 transmits a "set device address" (SetDA) command with parameters (N:0, Mask: 0100) where N represents which bit of the address register will be set in this operation (e.g., bit position 0 or 1), and where the mask tells the memory device 120 which of its data pins to observe in response to the command. For example, the mask value 0100 in this example tells the devices 120 to set the N=0 bit of the device address register based on the value observed on DQ2. Because the CA link is universally connected, both memory devices will receive this same command. Memory controller 110 furthermore outputs a data pattern (0100). Based on the connectivity of the devices 120, each device 120 will receive a different portion of this data pattern. Thus, memory device 120-1 observes a 1 on DQ2 and sets the N=0 bit of its memory device register to 1. Memory device 120-2 observes a 0 on DQ2 and sets the N=0 bit of its memory device register to 0.

Next, to set the N=1 bit of the device address registers, the memory controller 110 issues a second SetDA command with parameters N=1, Mask=0100, and outputs a data pattern 0100. Again observing DQ2 as specified by the mask value, memory device 120-1 observes a 0 on DQ2 and sets the N=1 bit of the device address register to 0. Memory device 120-2 observes a 1 on DQ2 and sets the N=1 bit of its device address register to 1. As can be seen, memory devices 120 now have unique addresses which can be used by the memory controller 110 to individually address the devices in future commands. Once the device addresses are assigned, memory controller 110 can send additional commands to individually configure devices 120 based on their connectivity (e.g., configuring the multiplexers). Furthermore, the device address may be used as a header to commands (e.g., read, write, erase, etc.) to individually address each device 120.

In one embodiment, the technique described above can be implemented by memory device 120 applying a logic operation to the mask value and its observed data values. For example, in one embodiment, memory device 120 achieves the result above by applying a logic operation comprising an OR reduction of the bitwise AND of MASK and DQ to set or clear the Nth bit of the device address register (DevAddr):

DevAddr(N)=|(Mask&DQ)

where & represents a bitwise AND operation and | represents an OR-reduction operation. Thus, |(A & B) outputs a 1 if and only if A and B both have a 1 in the same bit position.

As will be apparent, devices can be assigned addresses in this manner for other connectivity configurations by using a mask and data pattern appropriate for that particular connectivity configuration. For example, in FIG. 10B, unique addresses are assigned to jointly selected devices configured in a {UD-UC, LD-LC} connectivity configuration. Here, a first data pattern 0100 is outputted together with a first SetDA command having parameters N=0, Mask=0100, and a second data pattern 0001 is outputted together with a second SetDA command having parameters N=1, Mask=0001. As can be seen, this set of global commands and individually targeted data assigns unique addresses to each of the jointly selected devices 120 in this particular connectivity configuration.

Figure 10C:
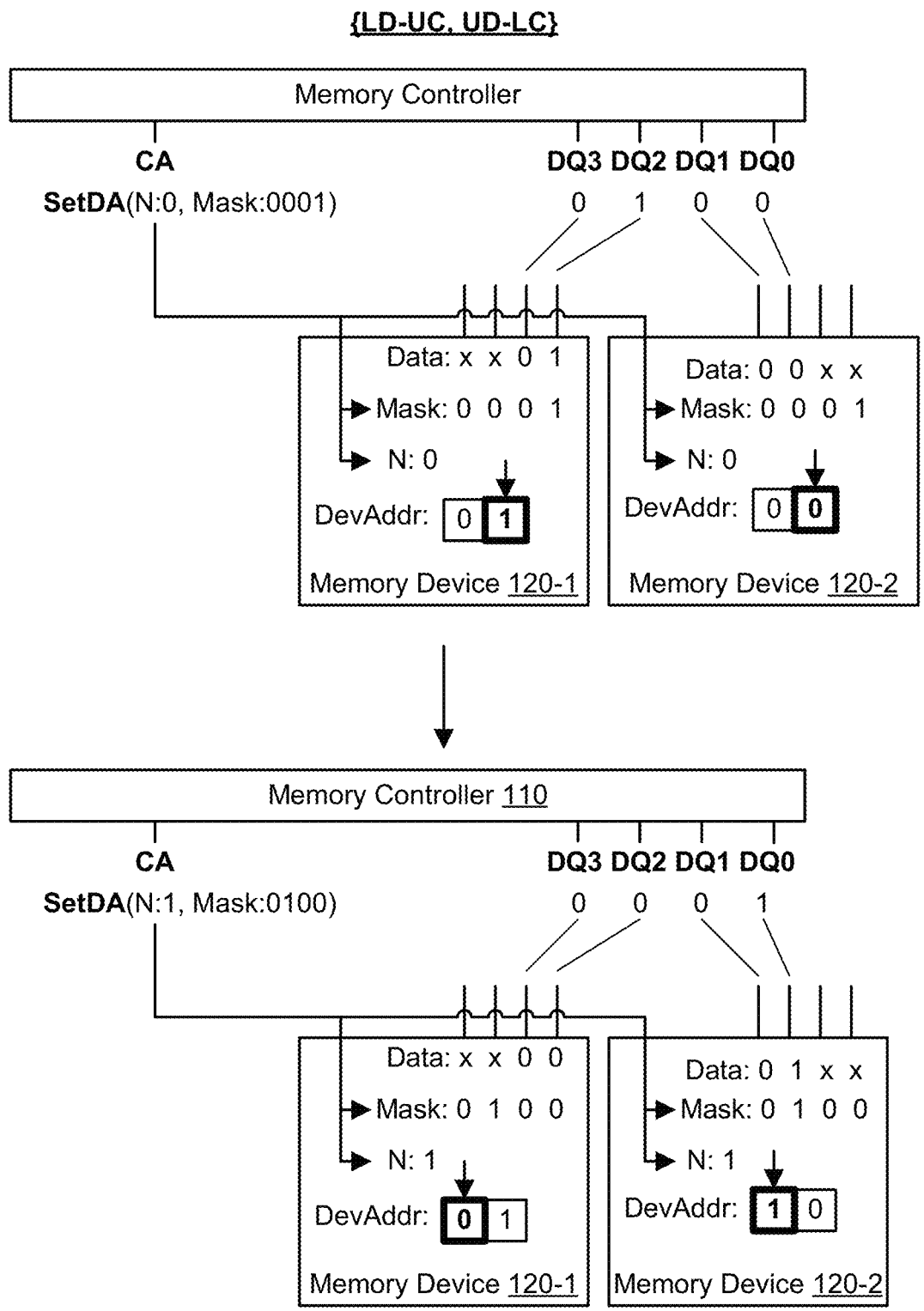
FIG. 10C is a diagram illustrating an example embodiment of data communicated between a memory controller and two jointly selected memory devices for assigning unique addresses to each of the jointly selected memory devices when the memory devices are configured in a third example connectivity configuration.

FIG. 10C illustrates an example for assigning address to jointly selected devices configured in a {LD-UC, UD-LC} connectivity configuration. Here, a first data pattern 0100 is outputted together with a first SetDA command having parameters N=0, Mask=0001, and a second data pattern 0001 is outputted together with a second SetDA command having parameters N=1, Mask=0100.

Figure 10D:
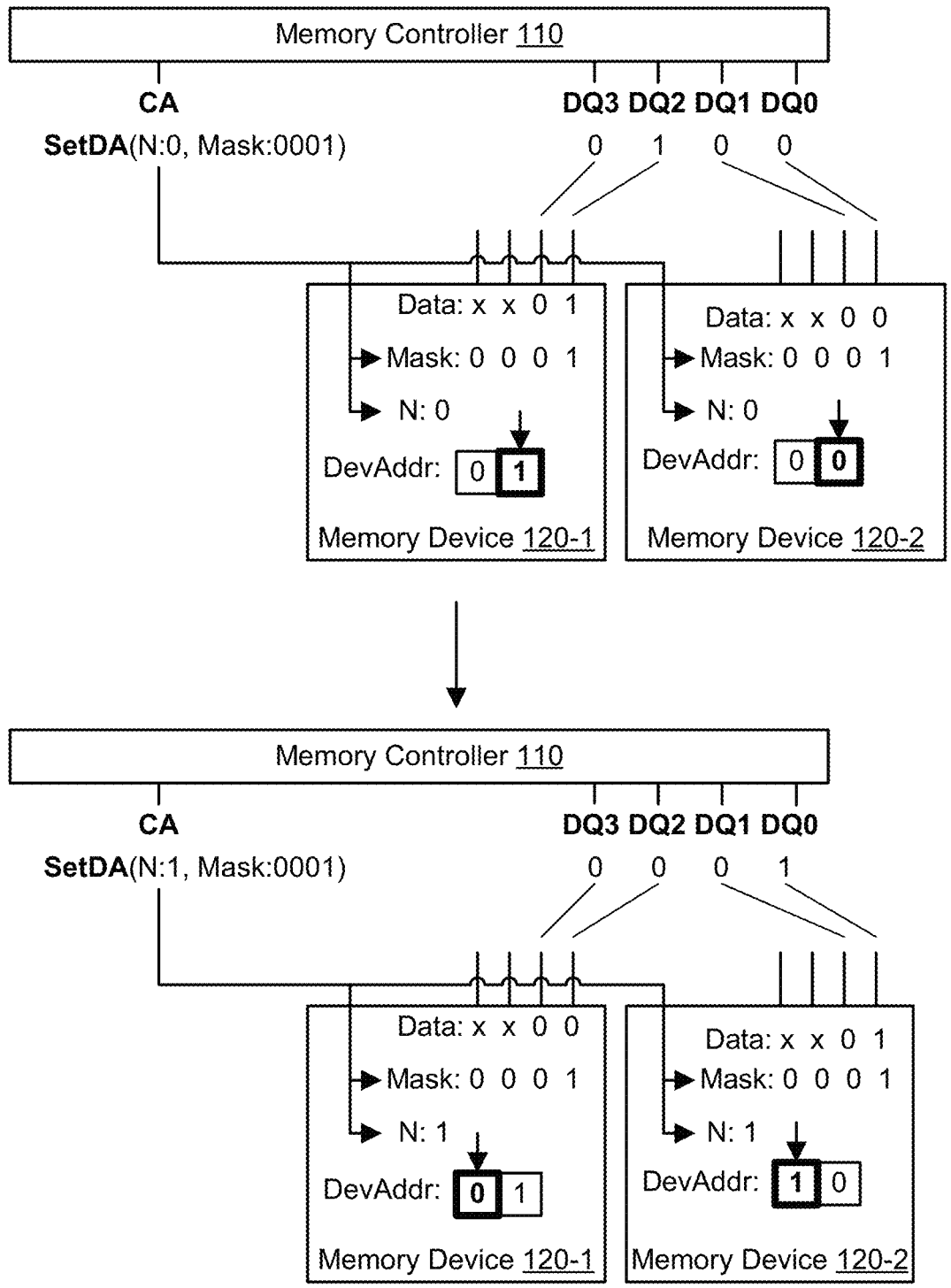
FIG. 10D is a diagram illustrating an example embodiment of data communicated between a memory controller and two jointly selected memory devices for assigning unique addresses to each of the jointly selected memory devices when the memory devices are configured in a fourth example connectivity configuration.

FIG. 10D an example is illustrated for assigning address to jointly selected devices configured in a {LD-UC, LD-LC} connectivity configuration. Here, a first data pattern 0100 is outputted together with a first SetDA command having parameters N=0, Mask=0001, and a second data pattern 0001 is outputted together with a second SetDA command having parameters N=1, Mask=0001.

As will be apparent, similar principles may be applied to assign addresses for jointly selected devices in other connectivity configurations not illustrated in the examples. Furthermore, similar principles could be applied to assign addresses to four jointly selected devices (e.g., by sending four appropriate SetDA commands to set bits in a four bit device address register).

Upon reading this disclosure, those of ordinary skill in the art will appreciate still alternative structural and functional designs and processes for discovery and configuration of individually selected and/or jointly selected identical devices, through the disclosed principles of the present disclosure. For example, although the description an examples herein relate to connectivity between a memory controller and one or memory devices, similar principles may also be applied to discover connectivity between other types of devices having configurable data buses. Furthermore, the techniques described herein can be applied to devices having different bus widths or signal parameters. Thus, while particular embodiments and applications of the present disclosure have been illustrated and described, it is to be understood that the disclosure is not limited to the precise construction and components disclosed herein. Various modifications, changes and variations which will be apparent to those skilled in the art may be made in the arrangement, operation and details of the method and apparatus of the present disclosure herein without departing from the scope of the disclosure as defined in the appended claims.

What is claimed is:

1. A configurable width device comprising:
a multiplexer coupled to a plurality of data lines, the multiplexer selectively associating one or more of the plurality of data lines with one or more of a plurality of data pins;
address assignment logic to receive a device address setting command for setting a device address of the configurable width device, the device address setting command including a mask value from a command interface and a data pattern from the plurality of data pins, the address assignment logic to perform a logic operation on the data pattern from the plurality of data pins and the mask value included in the device address setting command, and the address assignment logic to assign the device address to the configurable width device based on an output of the logic operation;
a register to store the device address; and
memory command logic to receive a memory operation command, to identify if the memory operation command is individually directed to the device address of the configurable width device, and to process the memory operation command if the memory command is individually directed to the device address.

2. The configurable width device of claim 1, wherein the device address setting command includes an address bit parameter to identify a bit of the device address, and wherein the mask value indicates which bit of the data pattern is assigned to the bit of the device address.

3. The configurable width device of claim 1, wherein the mask value comprise a single bit set to a first logic value and remaining bits set to a second logic value.

4. The configurable width device of claim 1, wherein the data pattern comprises a single bit set to a first logic value and remaining bits set to a second logic value.

5. The configurable width device of claim 1, wherein the logic operation comprises an OR reduction of a bitwise AND of the mask value and the data pattern.

6. The configurable width device of claim 1, wherein the multiplexer is configurable between at least a first mode in which the multiplexer maps each of the data pins to a single data line and a second mode in which the multiplexer maps each of the data pins to two different data lines.

7. The configurable width device of claim 1, wherein the multiplexer comprises a full crossbar switch.

8. The configurable width device of claim 1, further comprising:
multiplexer control logic to control the multiplexer based on a configuration command addressed to the device address.

9. A method for operating a configurable width device comprising:
selectively associating, by a multiplexer, one or more of a plurality of data lines with one or more of a plurality of data pins;
receiving, by address assignment logic, a device address setting command for setting a device address of the configurable width device, the command including a mask value from a command interface and a data pattern from the plurality of data pins;
performing, by the address assignment logic, a logic operation on the data pattern from the plurality of data pins and the mask value included in the device address setting command, and the address assignment logic to assign the device address to the configurable width device based on an output of the logic operation;

storing, the device address to a register; and receiving a memory command;

identifying if the memory operation command is individually directed to the device address of the configurable width device; and processing the memory operation command if the memory operation command is individually directed to the device address.

10. The method of claim 9, wherein the device address setting command includes an address bit parameter to identify a bit of the device address, and wherein the mask value indicates which bit of the data pattern is assigned to the bit of the device address.

11. The method of claim 9, wherein the mask value comprise a single bit set to a first logic value and remaining bits set to a second logic value.

12. The method of claim 9, wherein the data pattern comprises a single bit set to a first logic value and remaining bits set to a second logic value.

13. The method of claim 9, wherein the logic operation comprises an OR reduction of a bitwise AND of the mask value and the data pattern.

14. The method of claim 9, wherein the multiplexer is configurable between at least a first mode in which the multiplexer maps each of the data pins to a single data line and a second mode in which the multiplexer maps each of the data pins to two different data lines.

15. The method of claim 9, wherein the multiplexer comprises a full crossbar switch.

16. The method of claim 9, further comprising:

configuring, by multiplexer control logic, the multiplexer based on a configuration command addressed to the device address.

17. A configurable width device comprising:

selecting means for selectively associating one or more of a plurality of data lines with one or more of a plurality of data pins;

device address setting command receiving means for receiving a device address setting command for setting a device address of the configurable width device, the device address setting command including a mask value from a command interface and a data pattern from the plurality of data pins;

device address setting command processing means for performing a logic operation on the data pattern from the plurality of data pins and the mask value included in the device address setting command;

assigning means for assigning the device address to the configurable width device based on an output of the logic operation;

storing means for storing the device address;

memory operation command receiving means for receiving a memory operation command;

identifying means for identifying if the memory operation command is individually directed to the device address of the configurable width device; and memory operation command processing means for processing the memory operation command if the memory operation command is individually directed to the device address.

18. The configurable width device of claim 17, wherein the device address setting command includes an address bit parameter to identify a bit of the device address, and wherein the mask value indicates which bit of the data pattern is assigned to the bit of the device address.

19. The configurable width device of claim 17, wherein the mask value comprise a single bit set to a first logic value and remaining bits set to a second logic value.

20. The configurable width device of claim 17, wherein the data pattern comprises a single bit set to a first logic value and remaining bits set to a second logic value.

* * * * *